United States Patent
Asano et al.

(10) Patent No.: US 6,682,968 B2
(45) Date of Patent: Jan. 27, 2004

(54) MANUFACTURING METHOD OF SCHOTTKY BARRIER DIODE

(75) Inventors: Tetsuro Asano, Gunma (JP); Katsuaki Onoda, Gunma (JP); Yoshibumi Nakajima, Tochigi (JP); Shigeyuki Murai, Gunma (JP); Hisaaki Tominaga, Gunma (JP); Koichi Hirata, Tochigi (JP); Mikito Sakakibara, Saitama (JP); Hidetoshi Ishihara, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/205,620

(22) Filed: Jul. 26, 2002

(65) Prior Publication Data

US 2003/0036252 A1 Feb. 20, 2003

(30) Foreign Application Priority Data

| Jul. 27, 2000 | (JP) | ........................ 2001-228047 |
| Jul. 27, 2001 | (JP) | ........................ 2001-228048 |
| Jul. 27, 2001 | (JP) | ........................ 2001-228049 |
| Aug. 30, 2001 | (JP) | ........................ 2001-261530 |
| Aug. 30, 2001 | (JP) | ........................ 2001-261531 |
| Aug. 30, 2001 | (JP) | ........................ 2001-261533 |

(51) Int. Cl.$^7$ ........................ H01L 21/8234
(52) U.S. Cl. ........................ 438/237; 438/604; 438/607
(58) Field of Search ........................ 438/602–610, 438/237

(56) References Cited

U.S. PATENT DOCUMENTS 4,313,971 A  *  2/1982  Wheatley, Jr. .............. 438/571

OTHER PUBLICATIONS

Yasoo Harada et al., "Transformation loss of beam lead type GaAs schottky Diode," Sanyo Electric Co., Ltd., Abstract. Abstract of "Research on High Reliability Beam Lead GaAs Schottky Diode."

* cited by examiner

*Primary Examiner*—Jey Tsai
(74) *Attorney, Agent, or Firm*—Morrison & Foerster LLP

(57) ABSTRACT

A Schottky barrier diode has a Schottky electrode formed on an operation region of a GaAs substrate and an ohmic electrode surrounding the Schottky electrode. The ohmic electrode is disposed directly on an impurity-implanted region formed on the substrate. A nitride film insulates the ohmic electrode from a wiring layer connected to the Schottky electrode crossing over the ohmic electrode. The planar configuration of this device does not include the conventional polyimide layer, and thus has a better high frequency characteristics than conventional devices.

23 Claims, 20 Drawing Sheets

MANUFACTURING METHOD OF SCHOTTKY BARRIER DIODE

BACKGROUND OF THE INVENTION

1. Field of the Invention

The invention relates to a manufacturing method of Schottky barrier diode device made of a compound semiconductor and applied in a high frequency circuit, specifically to a manufacturing method of Schottky barrier diode having a planar configuration to achieve a smaller operation region and overall chip size.

2. Description of the Related Art

The demand for high frequency devices has been rapidly increasing due to the expanding market for portable telephones and digital satellite communication equipment. Many of such devices include field effect transistors (referred to as FET, hereinafter) employing a gallium arsenide (referred to as GaAs, hereinafter) substrate because of its excellent high frequency characteristics. Typical application in this field includes local oscillation FETs for satellite antenna and monolithic microwave integrated circuits (MMIC) in which a plurality of FETs are integrated for wireless broadband. GaAs Schottky barrier diodes are also used in base stations of cellular phone system.

FIG. 1 is a cross-sectional view of an operation region of a conventional Schottky barrier diode. An n+ epitaxial layer 22 (a silicon impurity concentration of about $5\times10^{18}$ cm$^{-3}$) having a thickness of about 6 µm is formed on an n+ GaAs substrate 21. An n epitaxial layer 23 (a silicon impurity concentration of about $1.3\times10^{17}$ cm$^{-3}$) having a thickness of about 350 nm is formed on the n+ epitaxial layer 22. This n epitaxial layer serves as an operation region.

An ohmic electrode 28 makes a ohmic contact with the n+ epitaxial layer 22 and is made of a AuGe (gold-germanium alloy)/Ni (nickel)/Au (gold) metal layer disposed as a first wiring layer. A Ti (titanium)/Pt (platinum)/Au metal layer 32 serves as a second wiring layer, and is divided into wiring on the anode side and wiring on the cathode side. On the anode side, the Ti/Pt/Au metal layer makes a Schottky contact with the n epitaxial layer 23, and forms a Schottky contact region 31a. The portion of the Ti/Pt/Au metal layer on the anode side above the Schottky contact region 31a is referred to as a Schottky electrode 31 hereinafter. An anode electrode 34 is formed on and completely overlaps the Schottky electrode 31 and its extension. The anode electrode 34 provides an anode bonding pad and is formed by Au plating using the Schottky electrode 31 and its extension as a plating electrode. The Au metal layer serves as a third wiring layer. On the cathode side, the cathode electrode 35 provides a cathode bonding pad and is formed of the Au layer. The Ti/Pt/Au metal layer on the cathode side directly contacts the ohmic electrode 28. The edge of the Schottky electrode 31 needs to be on a top surface of a polyimide layer 30 to satisfy photolithographic requirements. Accordingly, a portion of the Schottky electrode 31, near the Schottky region 31a, overlaps by about 16 µm with the polyimide layer 30 formed on the ohmic electrode 28 on the cathode side. The entire substrate and epitaxial layers are at a cathode voltage except the Schottky contact region 31a. The polyimide layer 30 insulates the anode electrode 34 from the substrate 21 and the epitaxial layers. The crossing area between the anode electrode 34 and the underlining structure is about 1300 µm$^2$, which could provide a large parasitic capacitance to the device if the thickness of the polyimide layer 30 is small. Thus, to have a reasonably small parasitic capacitance, the thickness of the polyimide layer must be as large as 6–7 µm even though the polyimide film 30 has a relatively low dielectric constant.

The n epitaxial layer 23 of the lower impurity concentration ($1.3\times10^{17}$ cm$^{-3}$) is necessary for assuring a Schottky contact region 31a with good Schottky characteristics and a high breakdown strength (10V). The ohmic electrode 28 is formed directly on the n+ epitaxial layer 22 for reducing the resistance at the contact. For this reason, a mesa etching process is necessary for exposing the top surface of the n+ epitaxial layer 22. The n+ GaAs substrate 21 underneath the n+ epitaxial layer 22 also has a high impurity concentration, and has a backside electrode made of the AuGe/Ni/Au metal layer for an external contact from the backside.

FIG. 2 is a schematic top view of the conventional Schottky barrier diode having the operation region shown in FIG. 1. The Schottky contact region 31a formed on the n epitaxial layer 23 occupies a central portion of the device. The diameter of this region 31a is about 10 µm. A Schottky contact hole 29 is formed in the center of the Schottky contact region 31a. The Ti/Pt/Au metal layer of the second wiring layer is in direct contact with the n epitaxial layer 23 through the contact hole 29. The ohmic electrode 28 of the first wiring layer surrounds the circular Schottky contact region 31a, and occupies almost a half of the top surface of the device.

The Au metal layer of the third wiring layer provides bonding pads. On the anode side, the pad area is the minimum area allowed for wire bonding. On the cathode side, the pad area is large enough to provide multiple wire bonding, which is required for reducing the inductance generated at the bonding pad. The area of the anode bonding pad is about 40×60 µm$^2$ and the area for the cathode bonding pad is about 240×70 µm$^2$.

However, the mesa etching, which is required to expose the n+ epitaxial layer 22 through the n epitaxial layer 23 above for the direct contact with the ohmic electrode 28, is not stable enough to provide accurate patterning of the device. For example, the wet etching process used in the mesa etching may remove the oxide film 25 around the contact hole 29, leading to formation of mesa with an irregular shape. Such an irregular mesa structure may cause adverse effects on the Schottky barrier diode, especially the characteristics of the Schottky contact region 31a.

Furthermore, the polyimide layer 30 has a thickness as large as 6–7 µm to reduce the parasitic capacitance generated between the Schottky electrode 31 and the underlining structures (the epitaxial layers 22, 23 and the substrate 21) at the cathode voltage. To form a step coverage of this thick polyimide layer 30 by the electrodes 31, 34, 35, the edges of the polyimide layer 30 near the Schottky contact region 31a must have a tapered cross-section, as shown in FIG. 1. Such a tapered structure gives rise to a variation of the tapering angle, typically between 30 and 45 degrees. To accommodate this variation, a long separation between the Schottky contact region 31a and the ohmic electrode 28 is required. This separation leads to a large resistance and, thus, poor high frequency characteristics. The device shown in FIG. 1 has a separation of about 7 µm.

SUMMARY OF THE INVENTION

The invention provides a manufacturing method of Schottky barrier diode including providing a substrate made of a compound semiconductor, and epitaxially growing a first layer of a conduction type on the substrate. The method also includes implanting impurities into a predetermined region of the first layer to form an impurity-implanted region of the conduction type, forming a first electrode making an ohmic contact with the impurity-implanted region, and forming a second electrode making a Schottky contact with the first layer. This step is followed by forming a first metal wiring connected to the first electrode for external connection, and forming a second metal wiring connected to the second electrode for external connection.

The invention also provides a manufacturing method of Schottky barrier diode including providing a substrate made of a compound semiconductor, and epitaxially growing a first layer of a conduction type on the substrate. The method also includes implanting impurities into a predetermined region of the first layer to form an impurity-implanted region of the conduction type, and forming an electrode making an ohmic contact with the impurity-implanted region. The step further includes forming a patterned metal layer making a Schottky contact with the first layer and being in contact with the electrode. The patterned metal layer includes a first metal wiring from the electrode and a second metal wiring from the Schottky contact.

The invention further provides a manufacturing method of Schottky barrier diode including providing a substrate made of a compound semiconductor, implanting first impurities into a first predetermined region of the substrate to form an operation region of a conduction type, and implanting second impurities into a second predetermined region of the substrate to form an impurity-implanted region of the conduction type adjacent to the operation region. The method also includes forming a first electrode making an ohmic contact with the impurity-implanted region, and forming a second electrode making a Schottky contact with the operation region. The method further includes forming a first metal wiring connected to the first electrode for external connection, and forming a second metal wiring connected to the second electrode for external connection.

The invention also provides a manufacturing method of Schottky barrier diode including providing a substrate made of a compound semiconductor, implanting first impurities into a first predetermined region of the substrate to form an operation region of a conduction type, and implanting second impurities into a second predetermined region of the substrate to form an impurity-implanted region of the conduction type adjacent to the operation region. The method also includes forming an electrode making an ohmic contact with the impurity-implanted region, and forming a patterned metal layer making a Schottky contact with the operation region and being in contact with the electrode. The patterned metal layer includes a first metal wiring from the electrode and a second metal wiring from the Schottky contact.

DETAILED DESCRIPTION OF THE INVENTION

Figure 3:
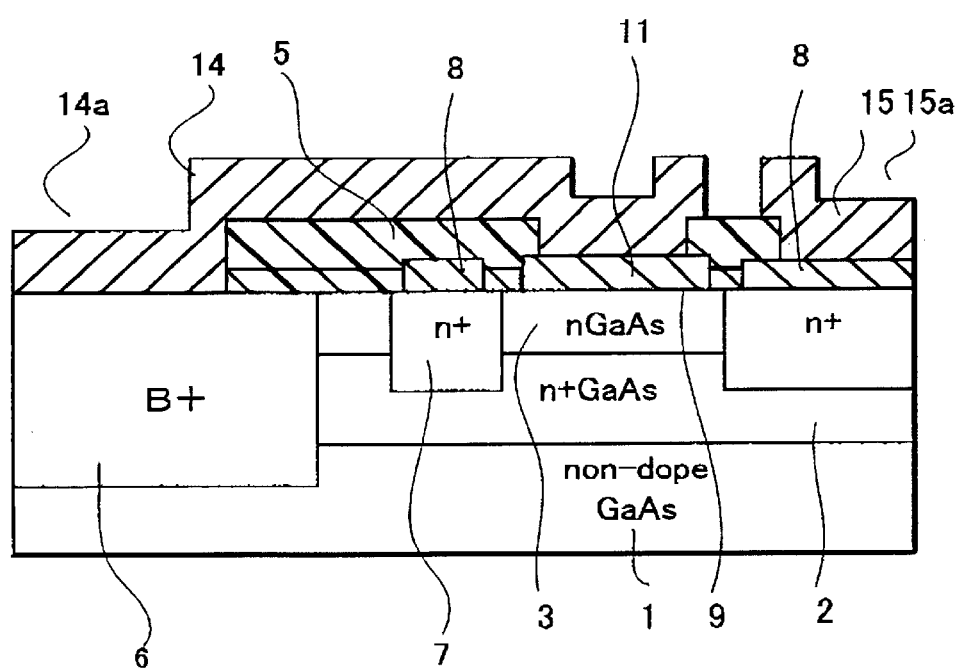
FIG. 3 is a cross-sectional view of a Schottky barrier diode of a first embodiment of this invention.

FIG. 3 is a cross-sectional view of a Schottky barrier diode of a first embodiment of this invention. Specifically, FIG. 3 focuses on an operation region of the first embodiment. The compound semiconductor substrate 1 of this embodiment is an undoped GaAs substrate. An n+ epitaxial layer 2 having a thickness of about 500 nm and a silicon impurity concentration of about $5 \times 10^{18}$ cm$^{-3}$ is formed on the substrate 1. An n epitaxial layer 3 having a thickness of about 250 nm and a silicon impurity concentration of about $1.3 \times 10^{17}$ cm$^{-3}$ is formed on the n+ epitaxial layer 2. As shown in FIG. 3, the device of the first embodiment has a planar configuration without any mesa structure.

An impurity-implanted region 7 is formed underneath the ohmic electrode 8, and penetrate through the n epitaxial layer 3 to reach the n+ epitaxial layer 2. The impurity-implanted region 7 surrounds a circular Schottky electrode 11, and completely overlaps with an ohmic electrode 8. In the area near the Schottky electrode 11, the impurity-implanted region 7 slightly extends beyond the ohmic electrode 8 toward the Schottky electrode 11. In this configuration, the separation between the Schottky electrode 11 and the impurity-implanted region 7 is 1 μm. The impurity-implanted region 7, which reaches from the ohmic electrode 8 to the n+ epitaxial layer 2 through the n epitaxial layer 3, replaces the mesa structure of conventional device and, thus achieves a planar device structure.

Figure 4:
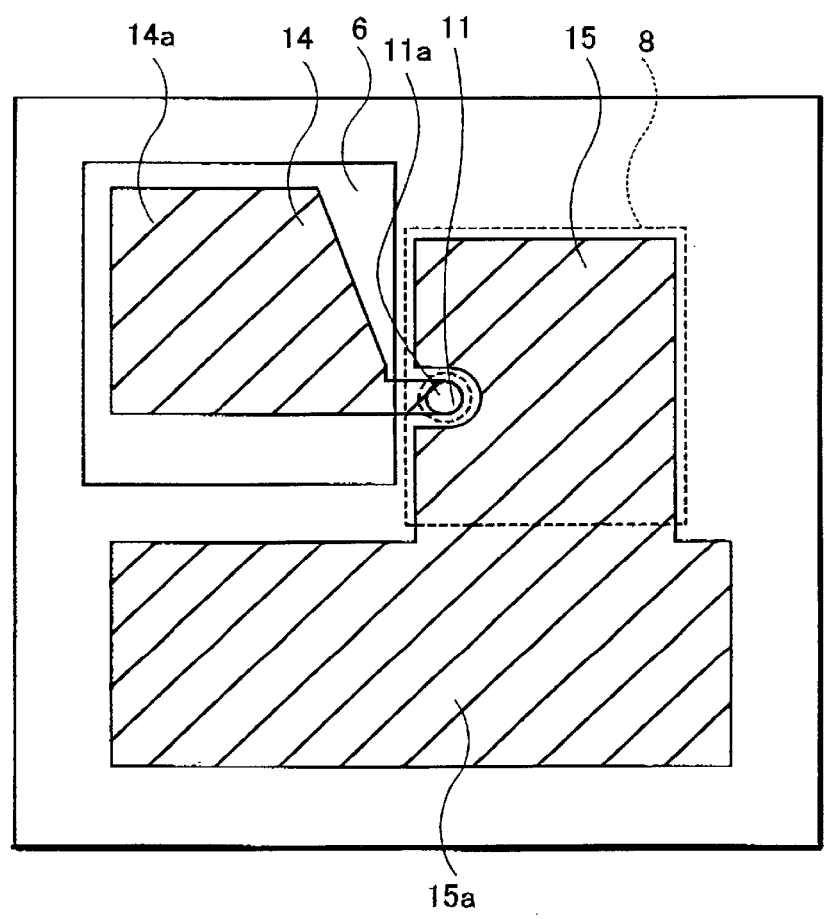
FIG. 4 is a schematic top view of the device of the first embodiment.

The ohmic electrode 8 disposed on the impurity-implanted region 7 is a part of a first wiring layer made of a AuGe/Ni/Au metal layer. The first wiring layer is formed by depositing AuGe, Ni and Au films in this order. The ohmic electrode 8 has a rectangular shape with a hole corresponding to the Schottky contact region 11a (FIG. 4). The separation between the Schottky electrode 11 and the ohmic electrode 8 is about 2 $\mu$m.

The Schottky electrode 11 makes a Schottky contact with the n epitaxial layer 3 through a Schottky contact hole 9 formed in a nitride film 5 covering the surface of the n epitaxial layer 3. The Schottky electrode 11 has a diameter of about 10 $\mu$m, and is a part of a second layer wiring made of a Ti/Pt/Au metal layer, which is formed by depositing Ti, Pt and Au films in this order. The n epitaxial layer 3 provides an operation region of the Schottky barrier diode underneath the Schottky electrode 11. The thickness of the n epitaxial layer 3 (250 nm) is determined to assure a proper breakdown voltage. As described below with respect to the descriptions about the manufacturing method of this device, the Schottky electrode 11 is formed immediately after a removal of the protecting nitride layer 5 from the n epitaxial layer 3 so that a Schottky contact with good characteristics is obtained.

A third wiring layer made of a Ti/Pt/Au metal layer is disposed on the Schottky electrode 11 and the ohmic electrode 8, and serves as an anode electrode 14 and as a cathode electrode 15. The anode electrode 14 is in contact with the Schottky electrode 11, and provides wiring between the Schottky contact region 11a and an anode bonding pad 14a. The nitride film 5 insulates the anode electrode 14 from the ohmic electrode, the n epitaxial layer 3 and other underlining structures, which are at a cathode voltage.

An insulating region 6 is formed underneath the anode bonding pad 14a by implanting boron ions into the epitaxial layers 2, 3 and the substrate 1. The insulating region 6 prevents the anode bonding pad 14a, which is at a anode voltage, from electrically contacting the epitaxial layers 2, 3, which are at the cathode voltage. Accordingly, the anode bonding pad 14a is disposed directly on the n epitaxial layers 2, 3 and the substrate without any polyimide layer or nitride film.

The cathode electrode 15 is in contact with the ohmic electrode 8, and provides wiring between the ohmic electrode 8 and an cathode bonding pad 15a. As shown in FIG. 4, the cathode electrode 15 partially surrounds the anode electrode extending into the Schottky contact region underneath the Schottky electrode 11. The impurity-implanted region 7, which are in contact with the ohmic electrode 8, the n epitaxial layer and the n+ epitaxial layer 2 are at the cathode voltage. Accordingly, the cathode bonding pad 15a is disposed directly on the n epitaxial layer 3.

Figure 5:
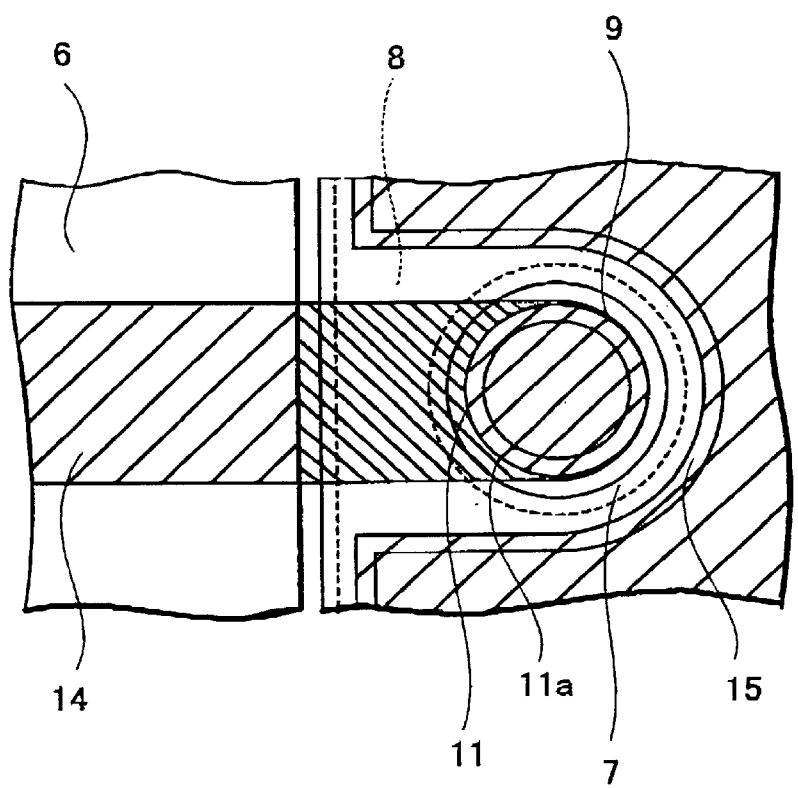
FIG. 5 is a partially expanded top of FIG. 4 to show detailed configuration around a Schottky electrode.

FIG. 4 is a schematic top view of the Schottky barrier diode of the first embodiment, and FIG. 5 is an expanded top view of the device of FIG. 4, focusing on the operation region of the Schottky barrier diode. The Schottky electrode 11 is located approximately in the center of the GaAs chip. The Schottky contact region is only the portion of the n epitaxial layer 3 underneath the circular Schottky electrode 11. The insulating region 6 is larger than the anode bonding pad 14a, which is formed on the insulating region 6.

The area denoted by the broken line is the ohmic electrode 8. The impurity-implanted region 7 (omitted form FIG. 4) is formed underneath the ohmic electrode 8 and covers approximately the same area of the substrate as the ohmic electrode. The Schottky electrode 11 is located in the hole created in the ohmic electrode 8. The cathode electrode 15 made of the third wiring layer is disposed on the ohmic electrode 8 to serve as wiring leading to the cathode bonding pad 15a. The external connection of the cathode electrode 15 has a significant influence on the high frequency characteristics, including inductance, of the Schottky barrier diode. In this embodiment, the size of the cathode bonding pad 15a is large enough to provide multiple wire bonding, as many as four, for reducing the inductance.

The area of the anode bonding pad 14a is about 60×70 $\mu$m, and the area of the cathode bonding pad 15a is about 180×70 $\mu$m. A stitch bonding process in this embodiment is used to fix bonding wires on the bonding pads. The stitch bonding can fix two wires on the bonding pad in one bonding procedure, and, thus, reduce the required area for the bonding.

The shaded area of FIG. 5 shows the intersection between the anode electrode 14 and the n epitaxial layer 3, which is at the cathode voltage. In this embodiment, the intersection area is about 100 $\mu m^2$, which is about one thirteenth of the intersection area of conventional device (1300 $\mu m^2$). Because of this reduction, the polyimide layer of conventional device can be replaced by a much thinner nitride film 5.

Because of this planar configuration without any mesa and polyimide layer, there is no need for accommodating dimensional variation due to processing inaccuracy. Accordingly, the separation between the Schottky electrode 11 and the ohmic electrode 8 is reduced to about 2 $\mu$m, and the separation between Schottky electrode 11 and the impurity-implanted region 7 is reduced to about 1 $\mu$m, in comparison to the conventional device, which has a separation of about 7 $\mu$m. Because the impurity-implanted region is similar to the ohmic electrode 8 in terms of carrier conduction, the device of this embodiment has a separation of about one seventh of the conventional device. This leads to an improvement of high frequency characteristics over the conventional device since a shorter separation provides a smaller resistance.

Furthermore, with the planar configuration, the chip size reduces from 0.27×0.31 mm² of the conventional device to 0.25×0.25 mm² of this embodiment. Notably, the size of the operation region is smaller than that of the conventional device by about one tenth.

Figure 6:
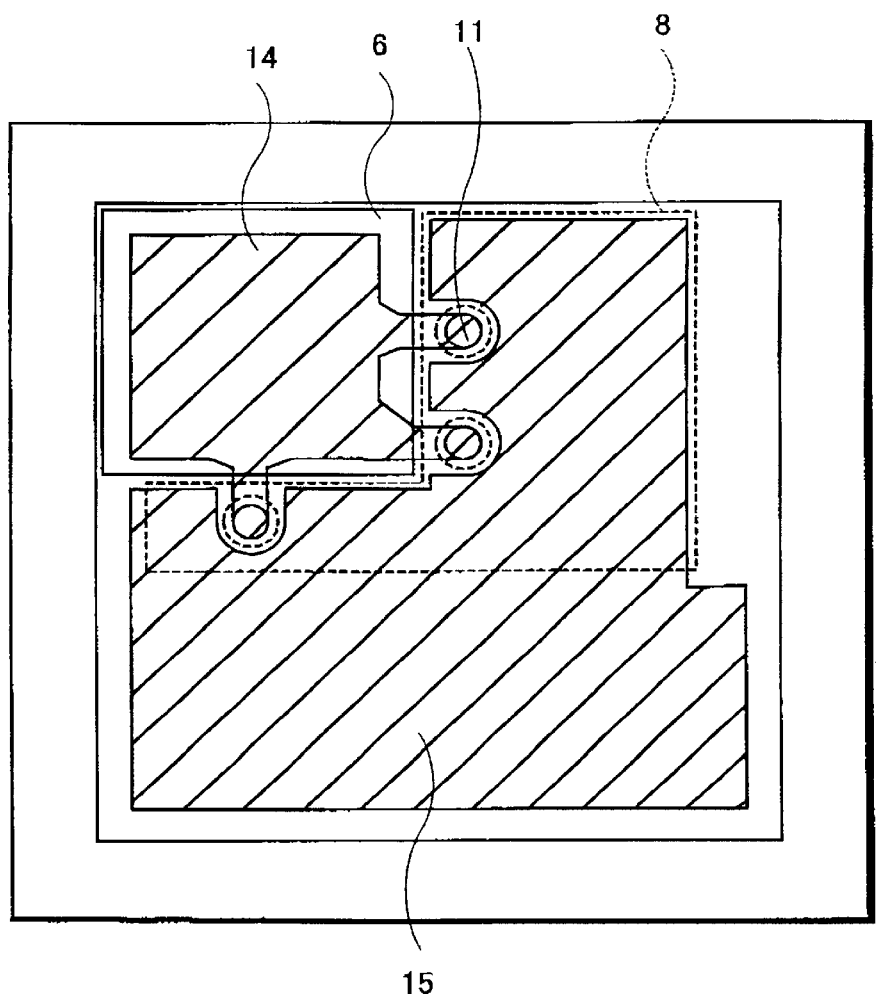
FIG. 6 is a schematic top view of a Schottky barrier diode of a modified first embodiment having three separate Schottky electrodes.

FIG. 6 is a schematic top view of a Schottky barrier diode of a modified first embodiment. The smaller size of the operation region of the first embodiment makes it possible to provide a plurality of operation regions in a single device. In the configuration of FIG. 6, three Schottky electrodes 11 are arranged in one device to further reduce the resistance. When the Schottky electrodes 11 are divided into smaller electrodes while keeping the total surface area of the electrode constant, the distance between the center of the Schottky electrode 11 and the impurity-implanted region 7 is further reduced, leading to further improvement of the high frequency characteristics of the device. Specifically, the shorter distance promotes efficient carrier trapping in the impurity-implanted region 7, leading to a reduced cathode resistance.

Figure 7:
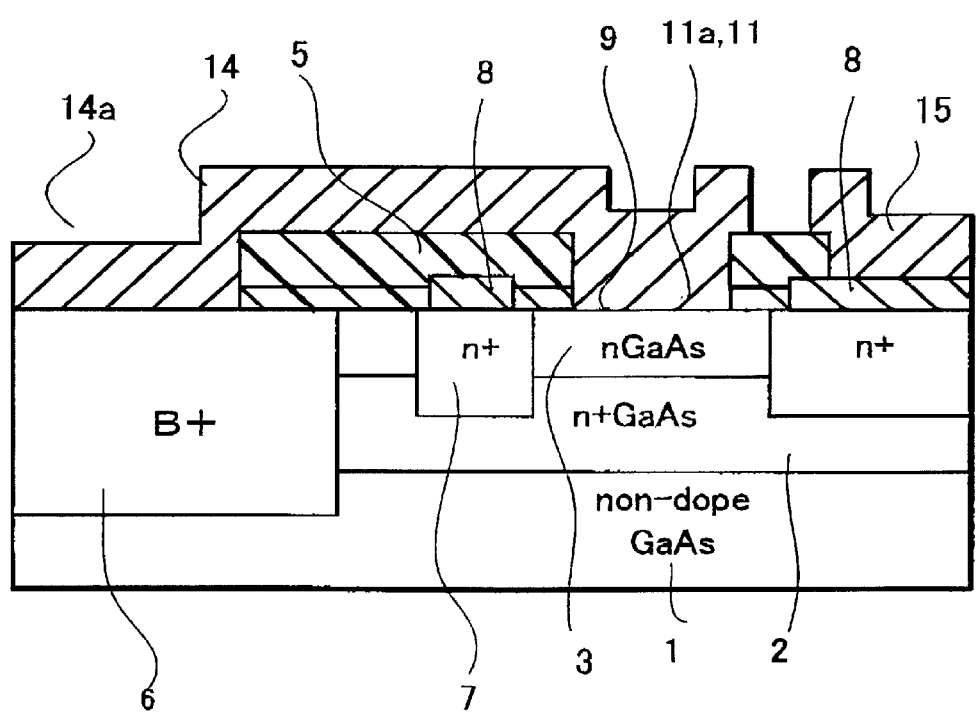
FIG. 7 is a cross-sectional view of a Schottky barrier diode of a second embodiment of this invention.

FIG. 7 is a cross-sectional view of a Schottky barrier diode device of a second embodiment of this invention. The configuration of the second embodiment is approximately the same as the configuration of the first embodiment except that the Schottky electrode 11 of the first embodiment is formed as a part of the anode electrode 14. Because both of the Schottky electrode 11 and the anode electrode 14 of the first embodiment are made of the Ti/Pt/Au metal layer, forming both electrodes as a single element made of the metal layer does not change the high frequency characteristics of the device. The region denoted by reference numeral 11a is the Schottky contact region formed by the contact between the anode electrode 14 and the n epitaxial layer 3. The separation between the impurity-implanted region 7 and the portion of the anode electrode 14 in the Schottky contact hole 9 is 1 µm.

Figure 8:
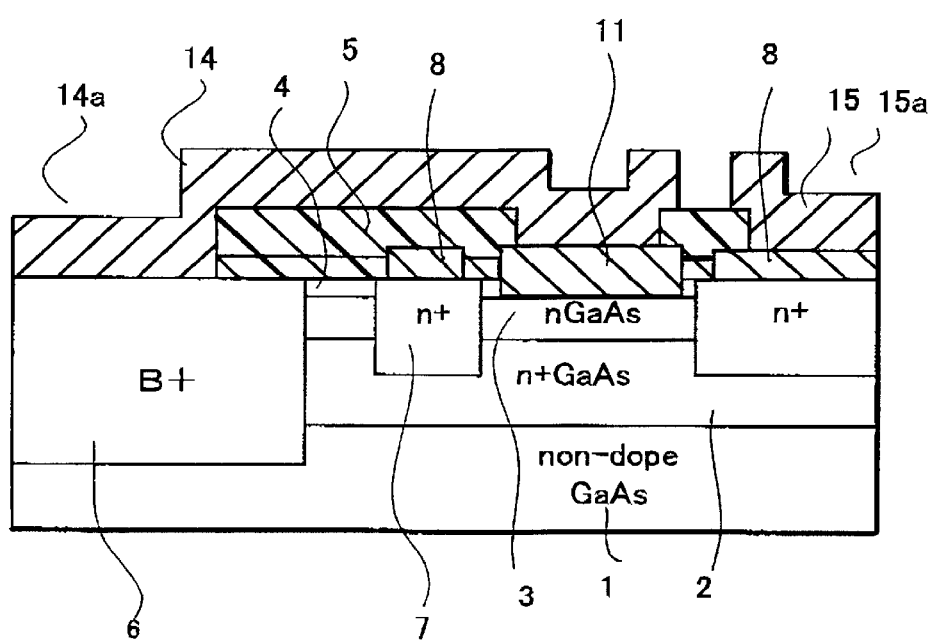
FIG. 8 is a cross-sectional view of a Schottky barrier diode of a third embodiment of this invention.

FIG. 8 is a cross-sectional view of a Schottky barrier diode device of a third embodiment of this invention. The configuration of the third embodiment is approximately the same as the configuration of the first embodiment except that the device has a stabilized layer 4 on top of the n epitaxial layer 3 and the Schottky electrode 11 penetrates the stabilized layer to make a Schottky contact with the n epitaxial layer 3. The stabilized layer 4 is made of undoped InGaP and has a thickness of about 20 nm. The stabilized layer 4 protects the surface of the n epitaxial layer 3 from external contamination so that a Schottky contact with excellent high frequency characteristics is formed. For this reason, the portion of the stabilized layer 4 corresponding to the Schottky contact region is removed immediately before the formation of the Schottky contact. Furthermore, the presence of the undoped InGap along the side of the Schottky electrode 11 reduces the capacitance generated in this portion. The impurity-implanted region 7 and the insulating region 6 are formed by injecting corresponding impurities into the corresponding regions through the stabilized layer 4.

Figure 9:
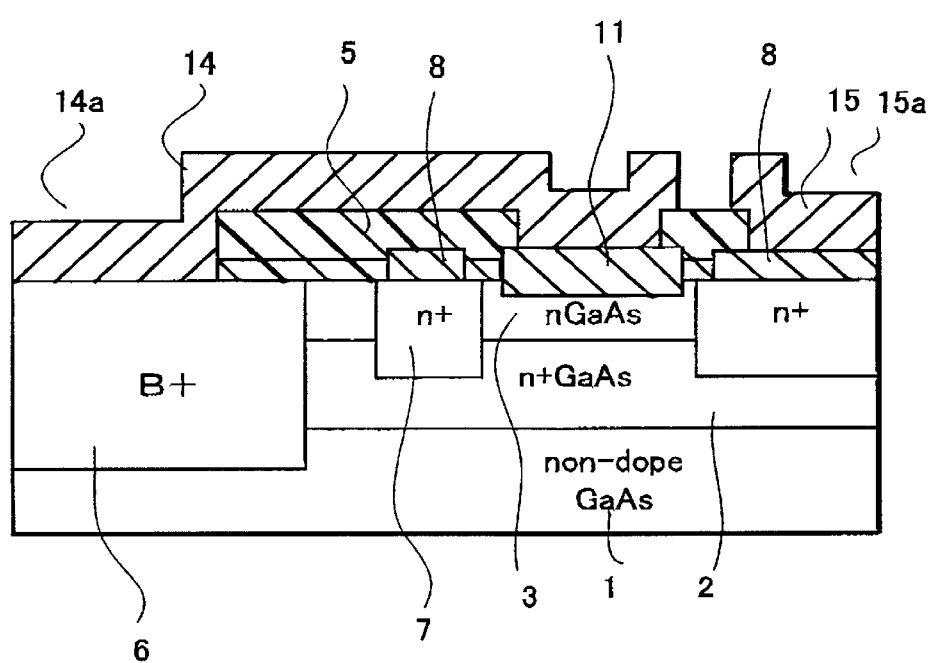
FIG. 9 is a cross-sectional view of a Schottky barrier diode of a fourth embodiment of this invention.

FIG. 9 is a cross-sectional view of a Schottky barrier diode device of a fourth embodiment of this invention. The configuration of the fourth embodiment is approximately the same as the configuration of the first embodiment except that the thickness of the n epitaxial layer 3 is about 270 nm and a portion of the Schottky electrode 11 is embedded in the n epitaxial layer 3. The Schottky electrode 11 formed on top of the n epitaxial layer is thermally diffused into the n epitaxial layer 3. The depth of the embedding of the Schottky electrode 11 is about 20 nm.

Figure 10:
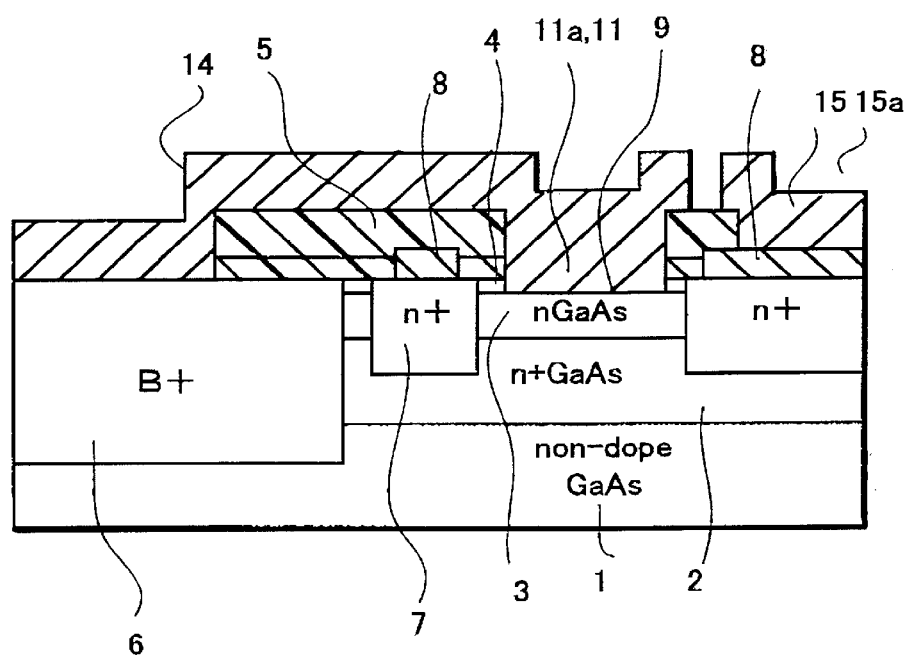
FIG. 10 is a cross-sectional view of a Schottky barrier diode of a fifth embodiment of this invention.

FIG. 10 is a cross-sectional view of a Schottky barrier diode device of a fifth embodiment of this invention. The configuration of the fifth embodiment is approximately the same as the configuration of the third embodiment except that the Schottky electrode 11 of the third embodiment is formed as a part of the anode electrode 14. Because both of the Schottky electrode 11 and the anode electrode 14 of the third embodiment are made of the Ti/Pt/Au metal layer, forming both electrodes as a single element made of the metal layer does not change the high frequency characteristics of the device. The region denoted by reference numeral 11a is the Schottky contact region formed by the contact between the anode electrode 14 and the n epitaxial layer 3. The separation between the impurity-implanted region 7 and the portion of the anode electrode 14 in the Schottky contact hole 9 is 1 µm.

Figure 11:
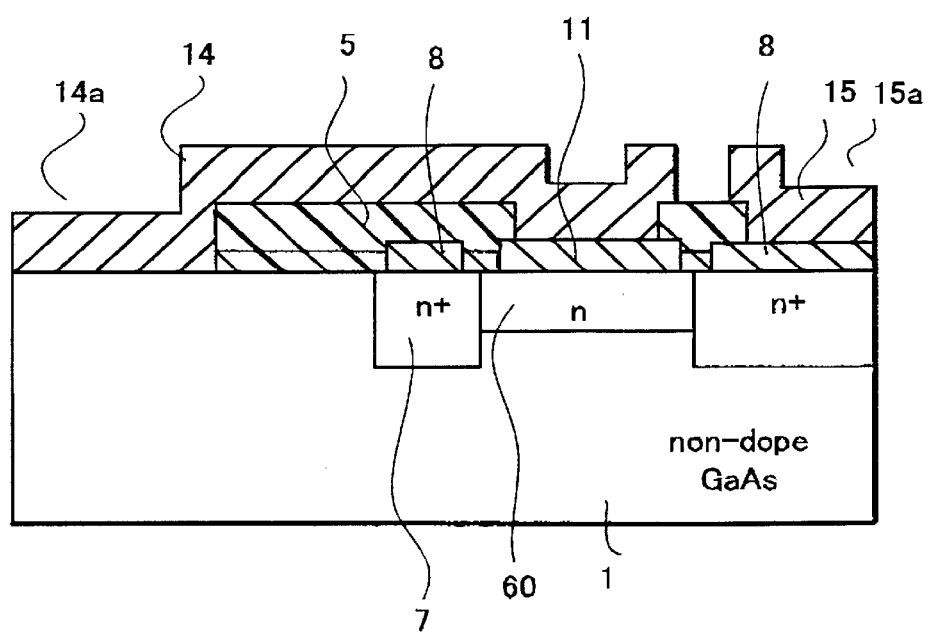
FIG. 11 is a cross-sectional view of a Schottky barrier diode of a sixth embodiment of this invention.

FIG. 11 is a cross-sectional view of a Schottky barrier diode of a sixth embodiment of this invention. The configuration of the sixth embodiment is approximately the same as the configuration of the first embodiment except that the impurity-implanted region 7 and the operation region of the Schottky barrier electrode are directly formed into the substrate made of undoped GaAs. The operation region is a central impurity-implanted region 60, which is formed by injecting the impurities, such as Si, into the area surrounded by the impurity-implanted region 7. The central impurity-implanted region 60 may have an impurity concentration of about $1.3 \times 10^{17}$ Cm$^{-3}$, and the impurity-implanted region 7 may have an impurity concentration of the same impurity (Si) of about $1.0 \times 10^{18}$ cm$^{-3}$. The depth of the central impurity-implanted region 3 is about 250 nm, and the depth of the impurity-implanted region 7 is about 300 nm. No epitaxial layer is needed because the operation region is directly formed in the undoped GaAs substrate. Furthermore, no insulating region is needed to place the anode bonding pad 14a on, because the anode bonding pad 14a is directly placed on the substrate 1, which is essentially an insulating material.

Figure 12:
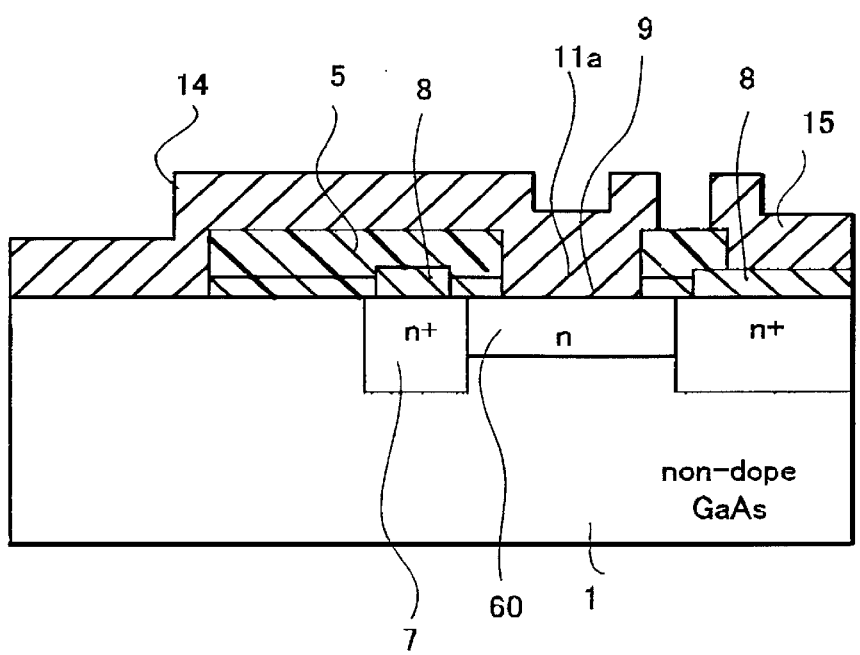
FIG. 12 is a cross-sectional view of a Schottky barrier diode of a seventh embodiment of this invention.

FIG. 12 is a cross-sectional view of a Schottky barrier diode device of a seventh embodiment of this invention. The configuration of the seventh embodiment is approximately the same as the configuration of the sixth embodiment except that the Schottky electrode 11 of the sixth embodiment is formed as a part of the anode electrode 14. Because both of the Schottky electrode 11 and the anode electrode 14 of the sixth embodiment are made of the Ti/Pt/Au metal layer, forming both electrodes as a single element made of the metal layer does not change the high frequency characteristics of the device. The region denoted by reference numeral 11a is the Schottky contact region formed by the contact between the anode electrode 14 and the n epitaxial layer 3. The separation between the impurity-implanted region 7 and the portion of the anode electrode 14 in the Schottky contact hole 9 is 1 µm.

Figure 13A:
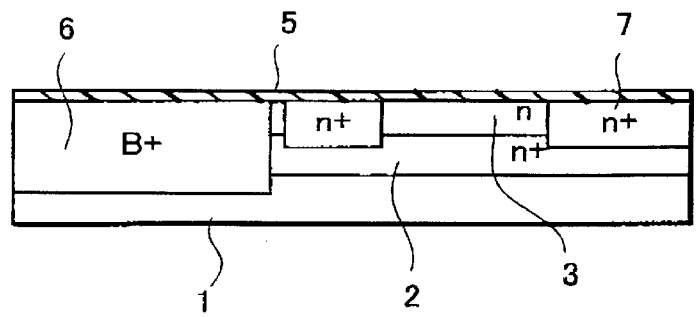
FIGS. 13A–13E show processing steps of a manufacturing method of the Schottky barrier diode of the first embodiment.

FIGS. 13A–13E show process steps of a manufacturing method of the Schottky barrier diode of the first embodiment. A device intermediate shown in FIG. 13A is prepared following the process steps below. First, an n+ epitaxial layer 2 is formed on an undoped GaAs substrate 1 by an MOCVD process. The n+ epitaxial layer 2 has a thickness of about 500 nm and a silicon impurity concentration of about $5 \times 10^{18}$ cm$^{-3}$. An n epitaxial layer 3 having a thickness of about 250 nm and a silicon impurity concentration of about $1.3 \times 10^{17}$ cm$^{-3}$ is formed on the n+ epitaxial layer 2. A nitride film 5 is, then, formed on the entire top surface of the device intermediate. A resist layer is formed on the nitride film 5 and is patterned to open a window for impurity injection to an insulating region 6 by a photolithographic process. Boron ions are injected through the window created in the resist film to form the insulating region 6 having a boron concentration of about $3 \times 10^{17}$ cm$^{-3}$, which reaches the undoped GaAs substrate 1.

Then, another resist layer is formed after the removal of the first resist layer, and is patterned to open a window for impurity injection to an impurity-implanted region 7 by the photolithographic process. Silicon impurities are injected through the window to form the impurity-implanted region 7 having a silicon concentration of about $1.0 \times 10^{18}$ cm$^{-3}$. The impurity-implanted region 7 penetrates the n epitaxial layer 3 and reaches the n+ epitaxial layer 2. It is better to inject the silicon impurities in a manner to assure an equal distribution of the impurities along the depth of the impurity-implanted region 7. One such method is to inject a predetermined dose of the impurities in a plurality of separate injection steps, each of which may has a different injection condition. After a removal of the second resist layer, another nitride film 5 is formed on the device intermediate for anneal protection, and the device intermediate is annealed to activate the impurity-implanted region 7 and the insulating region 6.

Figure 13B:
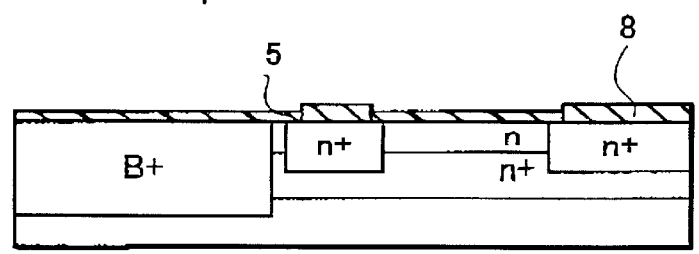

The process step following the steps of FIG. 13A is shown in FIG. 13B. A new resist layer is formed on the entire top surface of the device intermediate, and is patterned to open a window at a portion corresponding to a ohmic electrode formation by the photolithographic process. The nitride film 5 exposed in the window is removed to expose the top surface of the impurity-implanted region 7. A AuGe film, a Ni film and a Au film are evaporated on the exposed impurity-implanted region 7 in this order. After a removal of the resist film with a lift-off process, the device intermediate undergoes a heat treatment so that the deposited metal films turn into an ohmic electrode 8 making a ohmic contact with the impurity-implanted region 7.

Figure 13C:
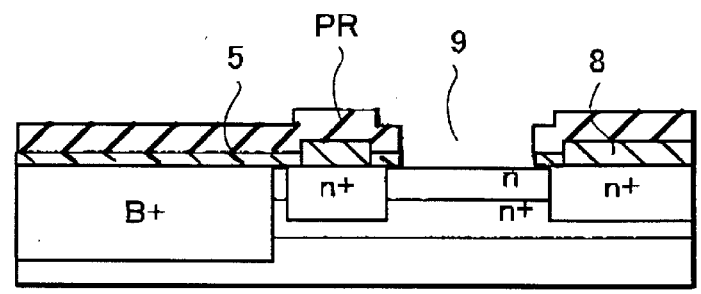

In the next step shown in FIG. 13C, a resist layer PR is formed on the entire top surface of the device intermediate, and is patterned to open a window at a portion corresponding to a Schottky electrode formation by the photolithographic process. The nitride film 5 exposed in the window is removed by a dry etching process. As a result, a Schottky contact hole 9 is formed to expose the top surface of the n epitaxial layer 3 at the bottom of the contact hole 9.

Figure 13D:
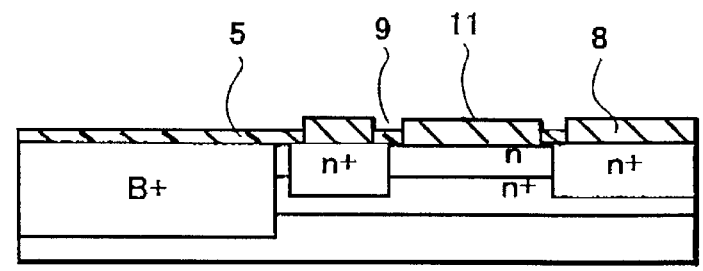

In the following step shown in FIG. 13D, a Ti film, a Pt film and a Au film are evaporated on the exposed n epitaxial layer 3 in this order. After a removal of the resist film PR with the lift-off process, Schottky electrode 11 is formed on the n epitaxial layer 3. Because the top surface of the n epitaxial layer 3 is covered and protected by the nitride film 5 and is removed immediately before the Schottky electrode formation, a Schottky contact can be formed on an ideal clean surface.

Figure 1:
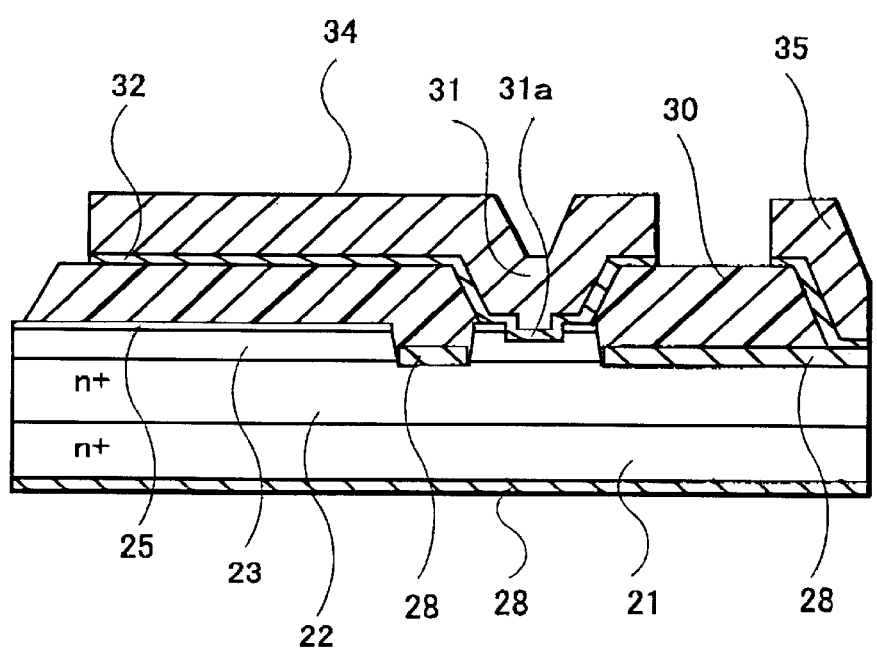
FIG. 1 is a cross-sectional view of a conventional Schottky barrier diode having a polyimide layer.
Figure 2:
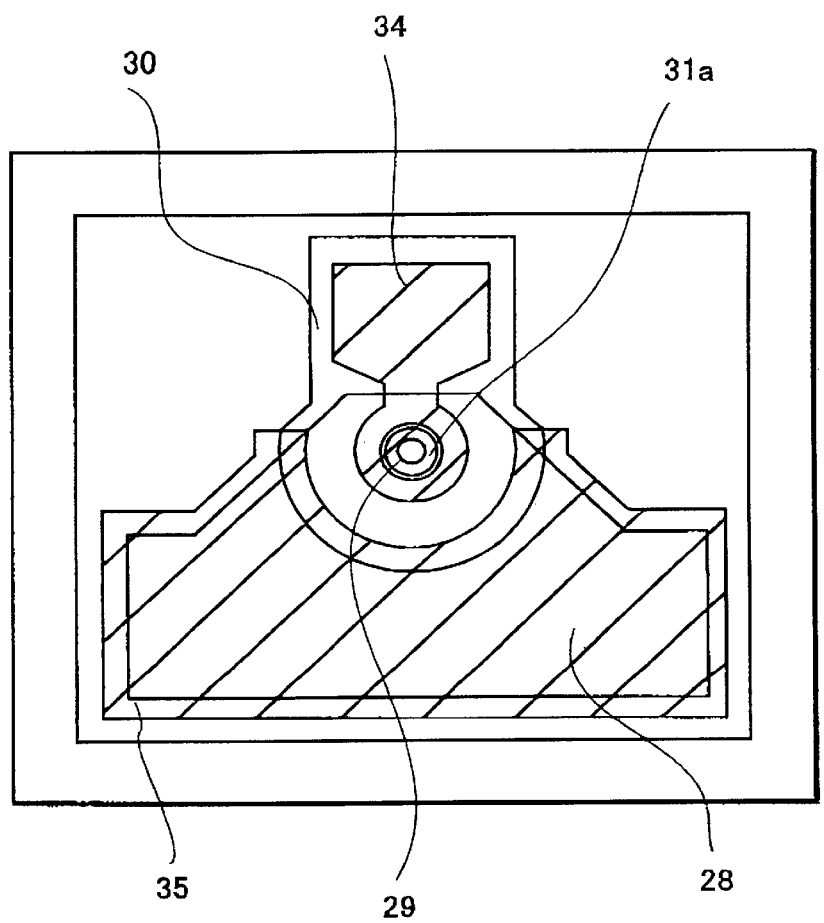
FIG. 2 is a schematic top view of the conventional device of FIG. 1.

In the conventional method to form the device of FIG. 1, the thickness of the operation region is determined by an etching process of an n epitaxial layer. However, an accurate control of the etching depth is difficult because there are lots of processing parameters to be controlled, including temperature, time, swing speed and width in an etching bath, and aging of etching solution. The manufacturing method of the first embodiment, however, dose not need such etching control because an n epitaxial layer of an optimal thickness is first formed on the substrate.

Furthermore, in the conventional process, the separation between the Schottky electrode and the ohmic electrode is as large as 7 μm to accommodate process inaccuracy due to the formation of tapered thick polyimide layer. However, in this manufacturing method, only the required breakdown voltage and the photolithographic accuracy should be taken into consideration. As a result, a separation of 1 μm is achieved.

Figure 13E:
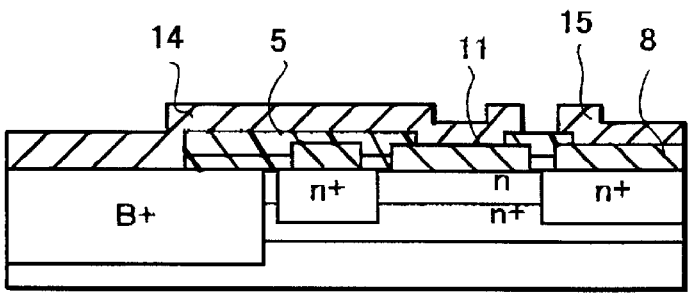

In the next step shown in FIG. 13E, an additional nitride film 5 having a thickness of about 500 nm is formed on the entire top surface of the device intermediate. A resist layer is formed on the nitride film 5, and is patterned to open windows at portions corresponding to Schottky electrode 11, ohmic electrode 8, an anode bonding pad 14a and a cathode bonding pad 15a by the photolithographic process. The nitride film 5 exposed in the windows is removed by a dry etching process. After a removal of the resist layer, another resist layer is formed on the nitride film 5, and is patterned to open second windows at portions corresponding to an anode electrode 14 and a part of a cathode electrode 15 adjacent to the Schottky electrode 11. The second resist layer also has the same windows as the first windows to directly expose the Schottky electrode 11, ohmic electrode 8, an anode bonding pad 14a and a cathode bonding pad 15a. Using this second resist layer as a mask, a metal wiring pattern is formed on the top surface of the device intermediate. The metal wiring is formed by successively depositing a Ti film, a Pt film and a Au film in this order. Accordingly, the Ti/Pt/Au metal layer directly contacts the Schottky electrode 11, and also directly contacts the ohmic electrode 8 on its cathode side. The portion of the ohmic electrode 8 under the anode electrode 14 is insulated from the Ti/Pt/Au metal layer by the nitride film 5 remaining on the top surface of the n epitaxial layer 3.

Because of this planar configuration of this embodiment, there is no need for forming a polyimide layer and a plated layer on top of the polyimide layer, as in the case of a manufacturing method of the conventional device of FIG. 1. Accordingly, the manufacturing method of the device of the first embodiment is much simpler and easier to control than the conventional method.

After a removal of the resist layer with the lift-off process and a subsequent backside rapping of the device intermediate, the device intermediate is transferred to an assembly process. In the assembly process, the compound semiconductor substrate 1 having individual diode elements thereon is diced and separated into individual chips. The individual chips are, then, mounted on frames and undergo a wire bonding process to fix bonding wires on the anode bonding pad 14a and the cathode bonding pad 15a. In this embodiment, gold wires are bonded to the bonding pads using a well known stitch bonding process. Finally, the individual chips are molded by a transfer molding process.

In the conventional manufacturing method, a thick Au plated layer is needed to increase the mechanical strength of the wiring layer and the bonding pad because the polyimide layer underneath generates stresses in the upper metal layer during wire bonding process and soldering process of assembled product. In the planar configuration of this embodiment, a much thinner wiring layer and bonding pad are used because the metal layer is disposed on the substrate without any intervening polyimide layer.

Figure 14A:
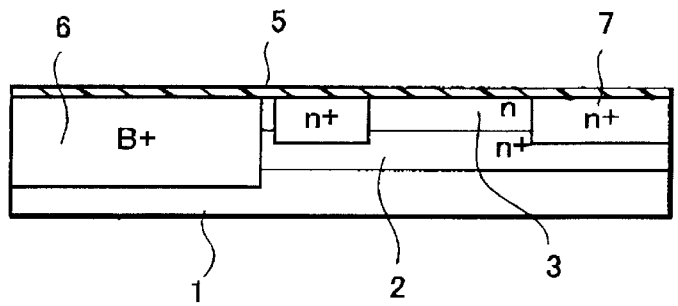
FIGS. 14A–14D show processing steps of a manufacturing method of the Schottky barrier diode of the second embodiment.
Figure 14B:
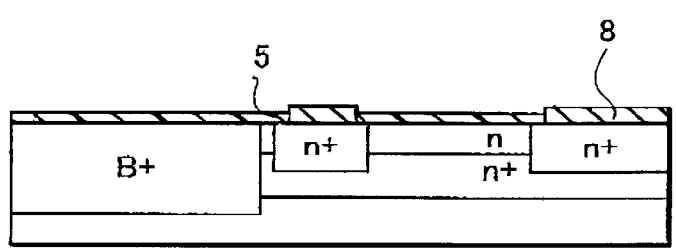
Figure 14C:
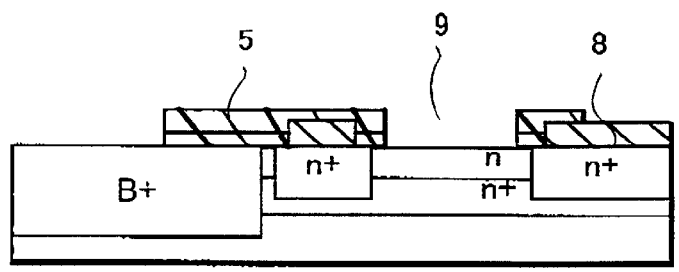
Figure 14D:
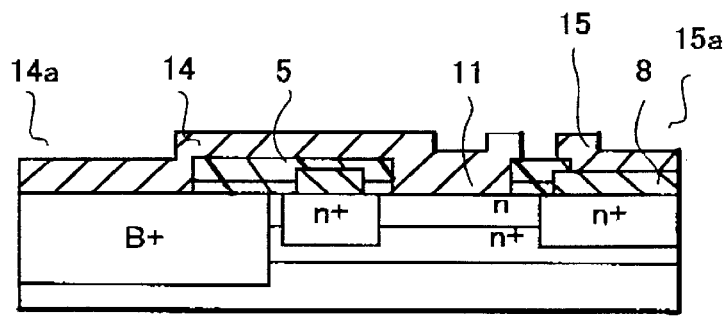

FIGS. 14A–14D show process steps of a manufacturing method of the Schottky barrier diode of the second embodiment. Steps of FIGS. 14A and 14B are approximately the same as the steps of FIGS. 13A and 13B. The impurity-implanted region 7 and the insulating region 6 are formed on the two epitaxial layers 2, 3 formed on the substrate 1 (FIG. 14A), and the ohmic electrode 8 is formed on the impurity-implanted region 7 (FIG. 14B). In the next step, however, the formation of the Schottky electrode 11 of the first embodiment is skipped. Instead, the additional nitride film 5 is formed on the device intermediate and patterned (FIG. 14C). The anode 14 is, then, directly formed on the n epitaxial layer 3, together with the cathode electrode 15 and the anode and cathode connecting pads 14a, 15a (FIG. 14D).

Figure 15A:
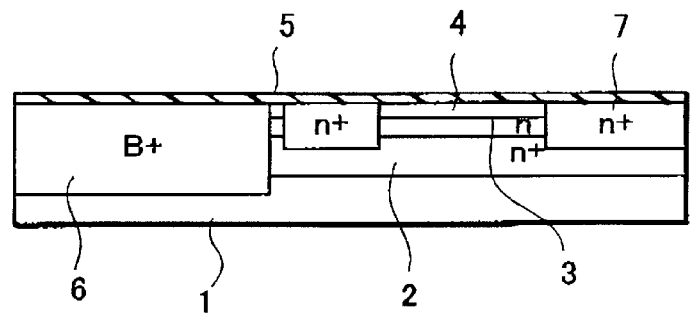
FIGS. 15A–15E show processing steps of a manufacturing method of the Schottky barrier diode of the third embodiment.
Figure 15B:
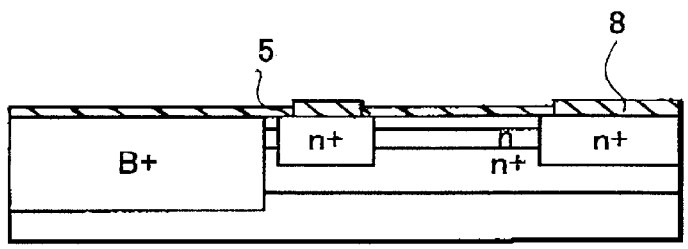
Figure 15C:
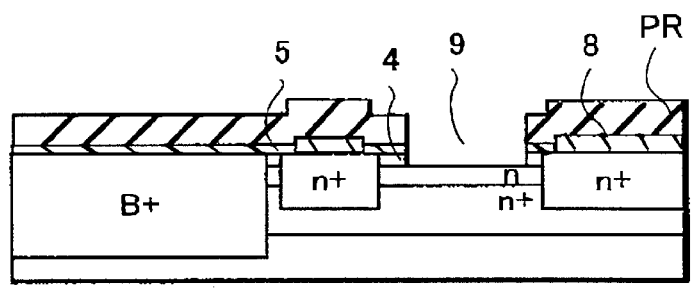
Figure 15D:
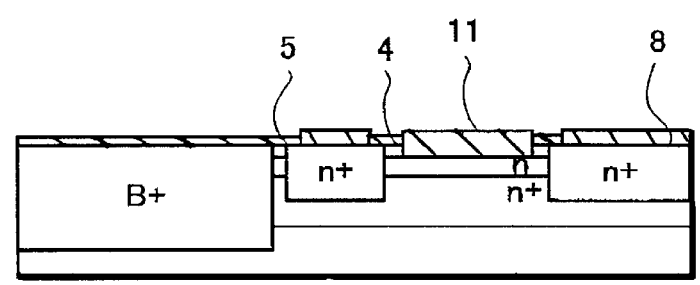
Figure 15E:
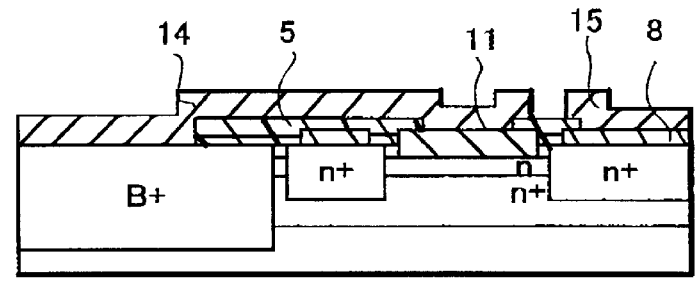

FIGS. 15A–15E show process steps of a manufacturing method of the Schottky barrier diode of the third embodiment. The steps are approximately the same as those of first embodiment except that a stabilized layer is formed on top of the n epitaxial layer 3. In the first step (FIG. 15A), an undoped InGaP layer 4 is formed on the n epitaxial layer 3, and the impurity-implanted region 7 and the insulating region 6 are formed by injecting corresponding impurities into those regions through the InGaP layer 4. The ohmic electrode 8 is formed on the impurity-implanted region 7 (FIG. 15B), and the contact hole 9 is formed through the nitride film 5 and the InGaP layer 4 by dry etching the nitride film 5 and wet etching the InGaP layer 4 to expose the top surface of the n epitaxial layer 3 (FIG. 15C). The etching rate of InGaP under the etching process is much higher than the etching rate of GaAs. Accordingly, only the InGaP layer 4 is removed by the etching process without damaging the GaAs portion of the n epitaxial layer. Immediately after the exposure of the n epitaxial layer, which has been protected by the stabilized layer 4 up to this point, the Schottky electrode 11 is formed on the top surface of the n epitaxial layer (FIG. 15D). Thus, a Schottky contact with excellent high frequency characteristics can be formed. The anode electrode 14 and the cathode electrode 15 are, then, formed on the device intermediate.

Figure 16A:
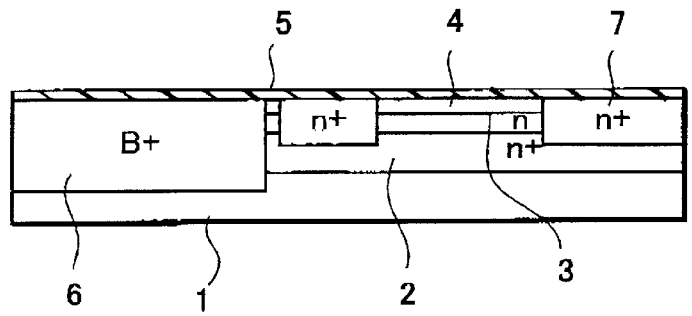
FIGS. 16A–16E show processing steps of a modified manufacturing method of the Schottky barrier diode of the third embodiment.
Figure 16B:
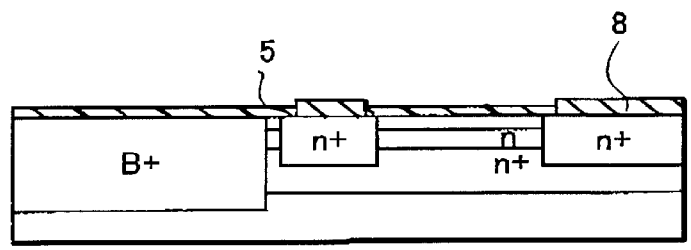
Figure 16C:
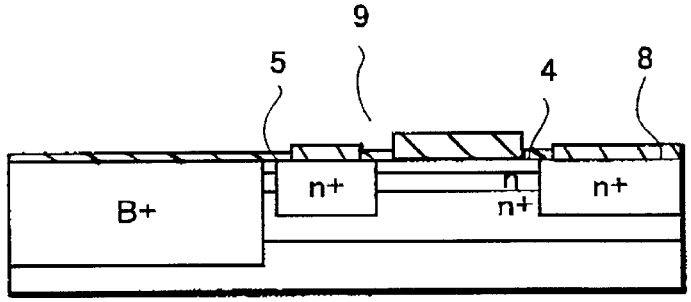
Figure 16D:
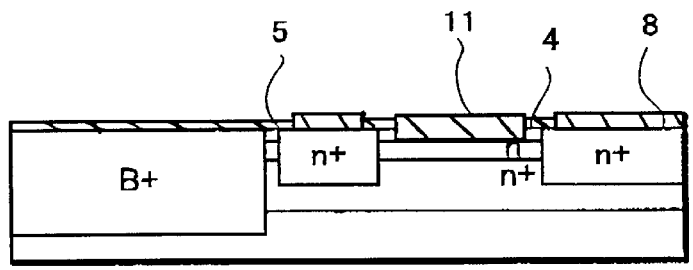
Figure 16E:
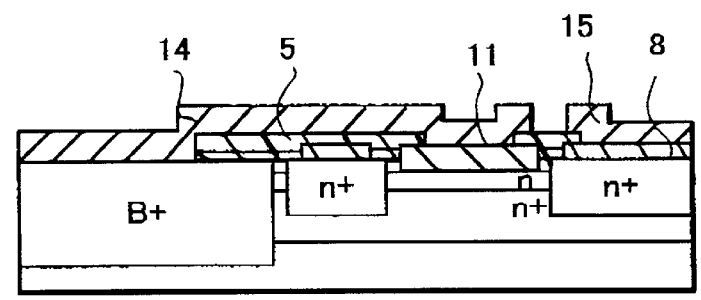

FIGS. 16A–16E show process steps of a modified manufacturing method of the Schottky barrier diode of the third embodiment. The steps are approximately the same as those of FIGS. 15A–15E except that a portion of the Schottky electrode 11 is embedded in the n epitaxial layer 3 by diffusion. The first two steps (FIGS. 16A and 16B) are approximately the same as those of FIGS. 15A and 15B. Then, the contact hole 9 is formed through the nitride film 5 by the dry etching to expose the top surface of the InGaP layer 4, and four metal films, a Pt film, a Ti film, a Pt film and a Au film, are deposited on the InGaP layer 4 in this order (FIG. 16C). The deposited films and the device intermediate are, then, heated at about 400° C. so that the Pt film, directly contacting the InGaP layer 4, is diffused into the InGaP layer 4 and reaches the n epitaxial layer 3 (FIG. 16D). The heat treatment should be controlled so that the penetration of the Pt film stops at the interface between the InGaP layer 4 and the n epitaxial layer. In the next step, the anode electrode 14 and the cathode electrode 15 are formed on the device intermediate (FIG. 16E).

Figure 17A:
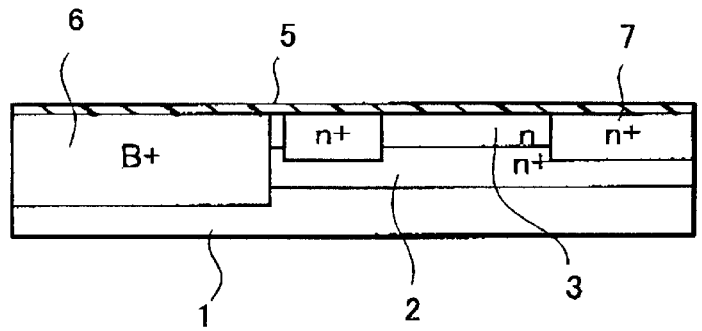
FIGS. 17A–17E show processing steps of a manufacturing method of the Schottky barrier diode of the fourth embodiment.
Figure 17B:
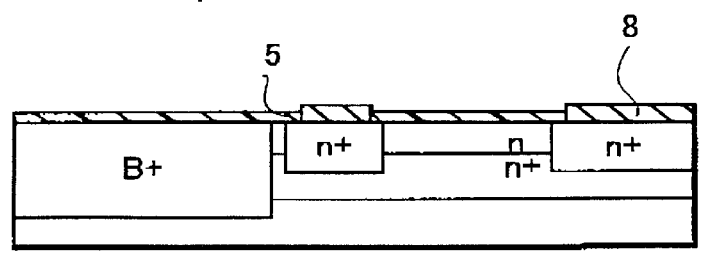
Figure 17C:
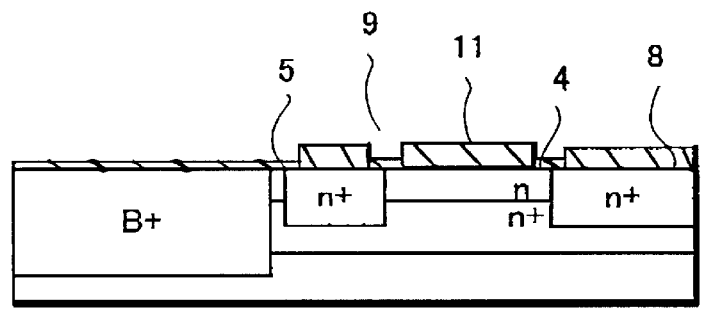
Figure 17D:
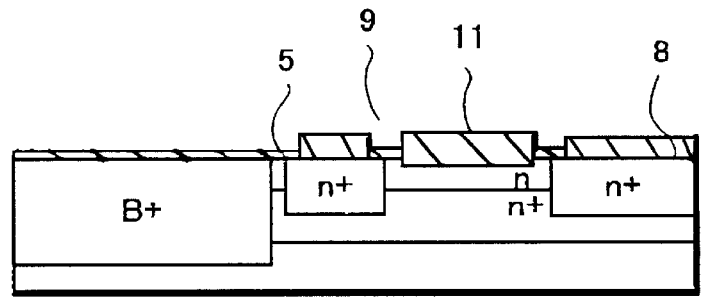
Figure 17E:
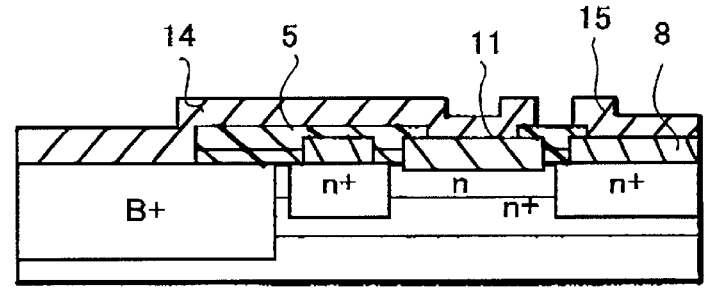

FIGS. 17A–17E show process steps of a manufacturing method of the Schottky barrier diode of the fourth embodiment. The steps are approximately the same as those of the first embodiment except that a portion of the Schottky electrode 11 is embedded in the n epitaxial layer 3. The first two steps (FIGS. 17A and 17B) are approximately the same as those of FIGS. 13A and 13B except that the thickness of the n epitaxial layer 3 is 270 nm. Then, the contact hole 9 is formed through the nitride film 5 by the dry etching to expose the top surface of the n epitaxial layer 3, and four metal films, a Pt film, a Ti film, a Pt film and a Au film, are deposited on the n epitaxial layer 3 in this order (FIG. 17C). The deposited films and the device intermediate are, then, heated at about 400° C. so that the Pt film is diffused into the n epitaxial layer 3 (FIG. 17D). The heat treatment should be controlled so that the depth of the diffused portion of the Pt film is about 20 nm. In the next step, the anode electrode 14 and the cathode electrode 15 are formed on the device intermediate (FIG. 17E).

Figure 18A:
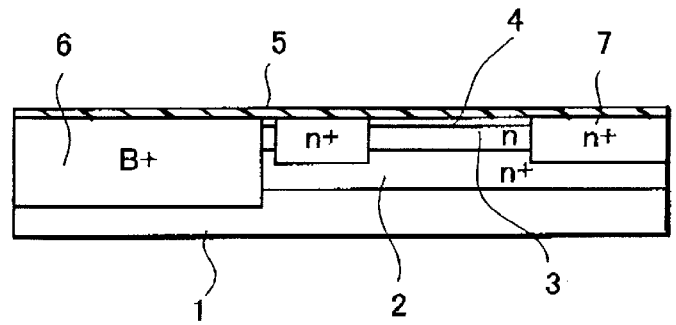
FIGS. 18A–18D show processing steps of a manufacturing method of the Schottky barrier diode of the fifth embodiment.
Figure 18B:
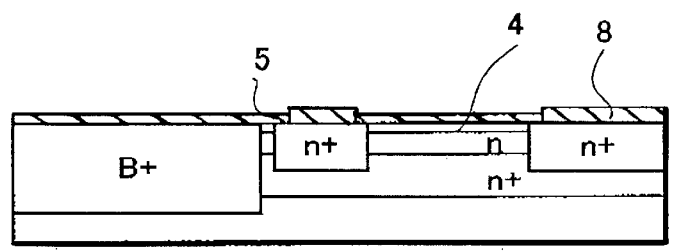
Figure 18C:
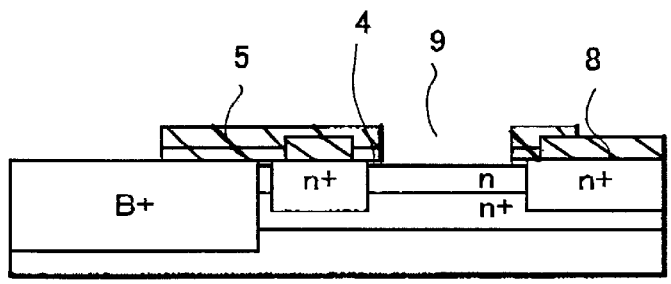
Figure 18D:
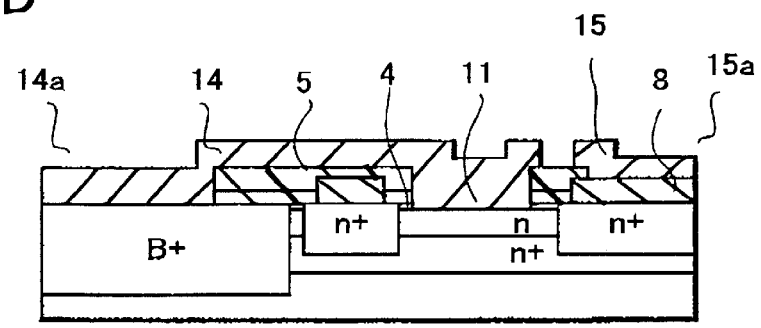

FIGS. 18A–18D show process steps of a manufacturing method of the Schottky barrier diode of the fifth embodiment. Steps of FIGS. 18A and 18B are approximately the same as the steps of FIGS. 15A and 15B. The impurity-implanted region 7 and the insulating region 6 are formed through the InGaP layer 4, which convers the two epitaxial layers 2, 3 formed on the substrate 1 (FIG. 18A). The ohmic electrode 8 is formed on the impurity-implanted region 7 (FIG. 18B). In the next step, however, the formation of the Schottky electrode 11 of the first embodiment is skipped. Instead, the additional nitride film 5 is formed on the device intermediate and patterned (FIG. 18C). The anode electrode 14 is, then, directly formed on the n epitaxial layer 3, together with the cathode electrode 15 and the anode and cathode connecting pads 14a, 15a (FIG. 18D).

Figure 19A:
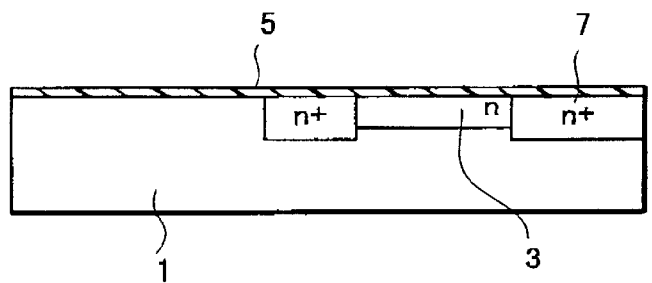
FIGS. 19A–19E show processing steps of a manufacturing method of the Schottky barrier diode of the sixth embodiment.
Figure 19B:
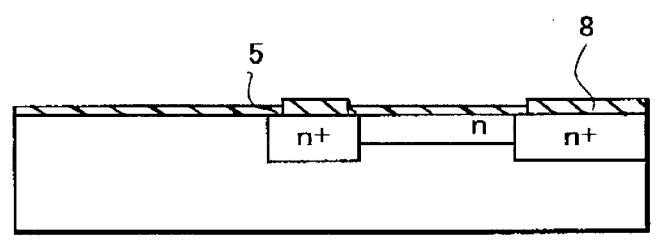
Figure 19C:
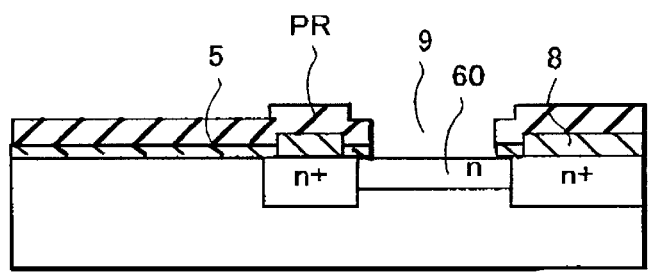
Figure 19D:
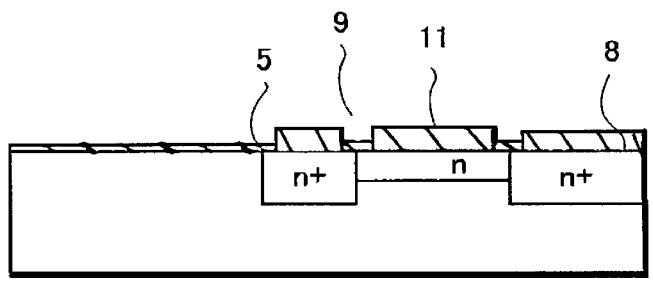
Figure 19E:
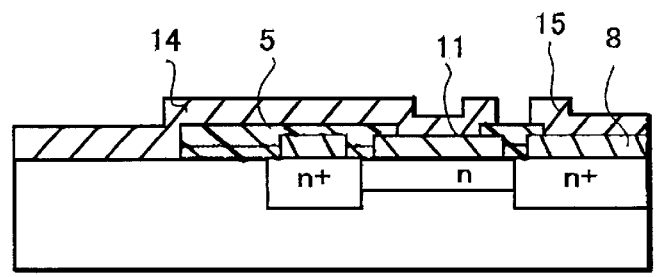

FIGS. 19A–19D show process steps of a manufacturing method of the Schottky barrier diode of the sixth embodiment. The steps are approximately the same as those of the first embodiment except that the impurity-implanted region 7 and the central impurity-implanted region 60, which is also formed by an injection of impurities, are formed directly on an insulating substrate 1. First, the nitride film 5 is formed on the top surface of the undoped GaAs substrate 1. A resist layer is formed on the nitride film 5 and is patterned to open a window for impurity injection to an area of the central impurity-implanted region 60. Silicon impurities are injected to the substrate 1 with a concentration of about $1.3 \times 10^{17}$ cm$^{-13}$ using the patterned resist as a mask. After removal of the resist layer, another resist layer is formed and is patterned to open a window for impurity injection to an area of the impurity-implanted region 7. Silicon impurities are injected to the substrate 1 with a concentration of about $1.0 \times 10^{18}$ cm$^{-13}$ using the patterned resist as a mask. At the edge of the central impurity-implanted region 60, the impurity-implanted region 7 slightly overlaps with the central impurity-implanted region 60 so that there is no separation between the two regions 7, 60. After the removal of this resist layer, yet another resist layer is formed for annealing the central impurity-implanted region 60 and the impurity-implanted region 7 (FIG. 19A). After this step, the ohmic electrode 8 is formed on the impurity-implanted region 7 (FIG. 19B), the contact hole 9 is formed to expose the central impurity-implanted region 60 (FIG. 19C), the Schottky electrode 11 is formed on the central impurity-implanted region 60 (FIG. 18D), and the anode electrode 14 and the cathode electrode 15 are formed on the device intermediate.

Figure 20A:
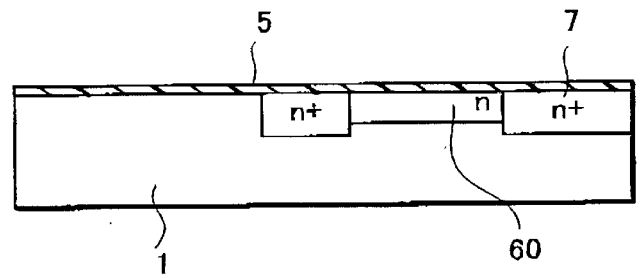
FIGS. 20A–20D show processing steps of a manufacturing method of the Schottky barrier diode of the seventh embodiment.
Figure 20B:
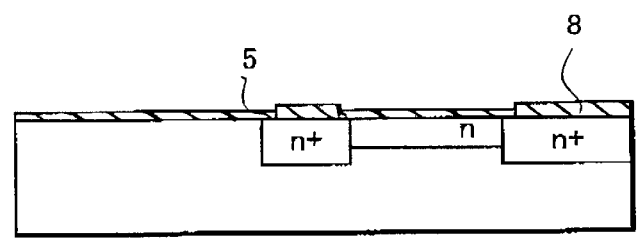
Figure 20C:
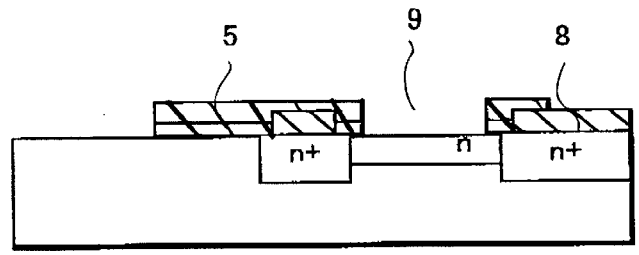
Figure 20D:
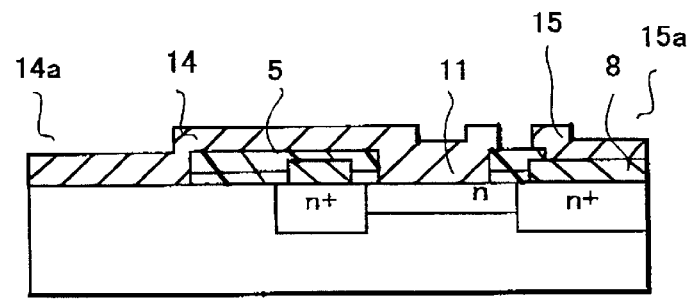

FIGS. 20A–20D show process steps of a manufacturing method of the Schottky barrier diode of the seventh embodiment. Steps of FIGS. 20A and 20B are approximately the same as the steps of FIGS. 19A and 19B. The central impurity-implanted region 60 and the impurity-implanted region 7 are formed on the substrate 1 (FIG. 20A), and the ohmic electrode 8 is formed on the impurity-implanted region 7 (FIG. 20B). In the next step, however, the formation of the Schottky electrode 11 of the sixth embodiment is skipped. Instead, the additional nitride film 5 is formed on the device intermediate and patterned (FIG. 20C). The anode 14 is, then, directly formed on the central impurity-implanted region 60, together with the cathode electrode 15 and the anode and cathode connecting pads 14a, 15a (FIG. 20D).

The above is a detailed description of a particular embodiments of the invention which are not intended to limit the invention to the embodiments described. It is recognized that modifications within the scope of the invention will occur to a person skilled in the art. Such modifications and equivalents of the invention are intended for inclusion within the scope of this invention.

What is claimed is:

1. A manufacturing method of Schottky barrier diode comprising:

providing a substrate made of a compound semiconductor;

epitaxially growing a first layer of a conduction type on the substrate;

implanting impurities into a predetermined region of the first layer to form an impurity-implanted region of the conduction type;

forming a first electrode making an ohmic contact with the impurity-implanted region;

forming a second electrode making a Schottky contact with the first layer;

forming a first metal wiring connected to the first electrode for external connection; and forming a second metal wiring connected to the second electrode for external connection.

2. The manufacturing method of Schottky barrier diode of claim 1, further comprising epitaxially growing a second layer of the conduction type on the substrate before epitaxially growing the first layer, wherein the implanting of the impurities is such that the impurity-implanted region reaches the second layer through the first layer.

3. The manufacturing method of Schottky barrier diode of claims 1 or 2, further comprising forming a stabilized layer on the first layer before implanting the impurities.

4. The manufacturing method of Schottky barrier diode of claim 3, further comprising forming a contact hole for the second electrode in the stabilized layer before the forming of the second electrode.

5. The manufacturing method of Schottky barrier diode of claim 3, wherein the forming of the second electrode comprises depositing a Schottky metal film on the stabilized layer and diffusing a portion of the Schottky metal film into the stabilized layer so that the Schottky metal film is in contact with the first layer.

6. The manufacturing method of Schottky barrier diode of claim 5, wherein the Schottky metal film comprises a Pt film in contact with the first layer.

7. The Schottky barrier diode of claim 3, wherein the stabilized layer comprises an undoped InGaP layer.

8. The Schottky barrier diode of claim 3, wherein the stabilized layer has a higher etching rate than the first layer under an etching condition.

9. The manufacturing method of Schottky barrier diode of claim 1, wherein the forming of the second electrode comprises depositing a Ti film, depositing a Pt film on the Ti film and depositing a Au film on the Pt film.

10. The manufacturing method of Schottky barrier diode of claims 1 or 2, wherein the forming of the second electrode comprises depositing a Schottky metal film on the first layer and diffusing a portion of the Schottky metal film into the first layer.

11. The manufacturing method of Schottky barrier diode of claims 1 or 2, wherein the substrate comprises an undoped GaAs substrate.

12. A manufacturing method of Schottky barrier diode comprising:
    providing a substrate made of a compound semiconductor;
    epitaxially growing a first layer of a conduction type on the substrate;
    implanting impurities into a predetermined region of the first layer to form an impurity-implanted region of the conduction type;
    forming an electrode making an ohmic contact with the impurity-implanted region; and
    forming a patterned metal layer making a Schottky contact with the first layer and being in contact with the electrode; the patterned metal layer comprising a first metal wiring from the electrode and a second metal wiring from the Schottky contact.

13. The manufacturing method of Schottky barrier diode of claim 12, further comprising epitaxially growing a second layer of the conduction type on the substrate before epitaxially growing the first layer, wherein the implanting of the impurities is such that the impurity-implanted region reaches the second layer through the first layer.

14. The manufacturing method of Schottky barrier diode of claims 12 or 13, further comprising forming a stabilized layer on the first layer before implanting the impurities.

15. The manufacturing method of Schottky barrier diode of claim 12, wherein the patterned metal layer comprises a first bonding pad connected to the first metal wiring and a second bonding pad connected to the second metal wiring.

16. The manufacturing method of Schottky barrier diode of claims 12 or 13, wherein the substrate comprises an undoped GaAs substrate.

17. A manufacturing method of Schottky barrier diode comprising:
    providing a substrate made of a compound semiconductor;
    implanting first impurities into a first predetermined region of the substrate to form an operation region of a conduction type;
    implanting second impurities into a second predetermined region of the substrate to form an impurity-implanted region of the conduction type adjacent to the operation region;
    forming a first electrode making an ohmic contact with the impurity-implanted region;
    forming a second electrode making a Schottky contact with the operation region;
    forming a first metal wiring connected to the first electrode for external connection; and
    forming a second metal wiring connected to the second electrode for external connection.

18. The manufacturing method of Schottky barrier diode of claim 17, wherein the forming of the second electrode comprises depositing a Ti film, depositing a Pt film on the Ti film and depositing a Au film on the Pt film.

19. The manufacturing method of Schottky barrier diode of claim 17, wherein the substrate comprises an undoped GaAs substrate.

20. A manufacturing method of Schottky barrier diode comprising:
    providing a substrate made of a compound semiconductor;
    implanting first impurities into a first predetermined region of the substrate to form an operation region of a conduction type;
    implanting second impurities into a second predetermined region of the substrate to form an impurity-implanted region of the conduction type adjacent to the operation region;
    forming an electrode making an ohmic contact with the impurity-implanted region; and
    forming a patterned metal layer making a Schottky contact with the operation region and being in contact with the electrode; the patterned metal layer comprising a first metal wiring from the electrode and a second metal wiring from the Schottky contact.

21. The manufacturing method of Schottky barrier diode of claim 20, wherein the patterned metal layer comprises a first bonding pad connected to the first metal wiring and a second bonding pad connected to the second metal wiring.

22. The manufacturing method of Schottky barrier diode of claim 20, wherein the forming of the second electrode comprises depositing a Ti film, depositing a Pt film on the Ti film and depositing a Au film on the Pt film.

23. The manufacturing method of Schottky barrier diode of claim 20, wherein the substrate comprises an undoped GaAs substrate.

* * * * *